United States Patent [19]
Schulz

[11] Patent Number: 5,637,151
[45] Date of Patent: Jun. 10, 1997

[54] METHOD FOR REDUCING METAL CONTAMINATION OF SILICON WAFERS DURING SEMICONDUCTOR MANUFACTURING

[75] Inventor: Peter Schulz, Wappingers Falls, N.Y.

[73] Assignee: Siemens Components, Inc., Iselim, N.J.

[21] Appl. No.: 266,279

[22] Filed: Jun. 27, 1994

[51] Int. Cl.⁶ ................................................ C03C 23/00
[52] U.S. Cl. ............................. 134/2; 134/3; 134/26; 252/186.28
[58] Field of Search .......................... 134/2, 3, 41, 26; 252/186.28

[56] References Cited

U.S. PATENT DOCUMENTS

| | | | |
|---|---|---|---|
| 4,116,714 | 9/1978 | Basi | 134/3 |
| 4,264,374 | 4/1981 | Beyer et al. | 134/3 |
| 4,885,106 | 12/1989 | Lapham et al. | 134/3 |
| 4,913,823 | 4/1990 | Lipinski et al. | 210/699 |
| 4,963,283 | 10/1990 | Lapham et al. | 252/79.3 |
| 4,985,228 | 1/1991 | Kirskey | 423/584 |
| 5,051,134 | 9/1991 | Schnegg et al. | 134/3 |
| 5,213,622 | 5/1993 | Bohling et al. | 134/3 |
| 5,290,361 | 3/1994 | Hayashida et al. | 134/2 |

*Primary Examiner*—Scott Kastler

[57] ABSTRACT

A complex building agent, such as EDTA is added in a predetermined concentration to the "SC 1" step of a "PIRANHA-RCA" cleaning sequence for reducing the metal contamination left on the surface of a silicon wafer after completion of this cleaning step.

14 Claims, 2 Drawing Sheets

A. Piranha ($H_2SO_4$ + $H_2O_2$ + $H_2O$)

B. Water Rinsing

C'. SC 1' ($NH_4OH$ + $H_2O_2$ + $H_2O$ + Complex Building Agent*)

*e.g. EDTA or Dequest

D. Water Rinsing

E. SC 2 (HCl + $H_2O_2$ + $H_2O$)

F. Water Rinsing

G. Wafer Drying

A. Piranha ($H_2SO_4$ + $H_2O_2$ + $H_2O$)

B. Water Rinsing

C. SC 1 ($NH_4OH$ + $H_2O_2$ + $H_2O$)

D. Water Rinsing

E. SC 2 (HCl + $H_2O_2$ + $H_2O$)

F. Water Rinsing

G. Wafer Drying

FIG. 1 (Prior Art)

A. Piranha ($H_2SO_4 + H_2O_2 + H_2O$)

B. Water Rinsing

C'. SC 1' ($NH_4OH + H_2O_2 + H_2O$ + Complex Building Agent*)

*e.g. EDTA or Dequest

D. Water Rinsing

E. SC 2 ($HCl + H_2O_2 + H_2O$)

F. Water Rinsing

G. Wafer Drying

FIG. 2

METHOD FOR REDUCING METAL CONTAMINATION OF SILICON WAFERS DURING SEMICONDUCTOR MANUFACTURING

TECHNICAL FIELD OF THE INVENTION

The present invention relates generally to the fabrication of semiconductors, and more particularly to the cleaning of semiconductor or silicon wafers over the course of producing the ultimate semiconductor product, such as an integrated circuit, whereby the intermediary cleaning steps remove contaminates deposited upon the surface of the associated silicon wafers during prior processing steps.

BACKGROUND OF THE INVENTION

Typically, in producing complex semiconductor products, such as integrated circuit devices, thousands of processing steps are required to obtain the resultant product. In order to enhance profitability, it is important that the yield or numbers of useful integrated circuit devices obtained from a single silicon wafer during processing be maximized. Accordingly, semiconductor manufacturers go to great lengths to provide the greatest yield during the manufacturing of the semiconductor devices. Such devices are typically manufactured under clean room conditions in order to substantially eliminate any airborne contaminates from reaching the surface of the silicon wafers during processing, and reducing the yield. Also, during the actual processing of the silicon wafers, certain other processing steps may themselves cause contaminates to be deposited upon the wafer surface, making it necessary after predetermined processing steps have been completed, to clean the surface of the wafer before proceeding with subsequent processing or manufacturing steps, in order to ensure the highest possibly yield on the devices being produced.

A typical cleaning cycle during the manufacture of semiconductor products involves wet wafer cleaning, which usually involves a plurality of cleaning steps. Initial steps typically involve either spraying a mixture of chemicals and water onto the surface of the wafer, or immersing the wafer into such a mixture, followed by water rinse steps and drying steps, before the silicon wafer proceeds to further device processing. A cleaning sequence commonly known in the art as "RCA-clean" is often used in semiconductor manufacturing. One of the steps used in the "RCA-clean" is commonly known as the "SC 1" step, for removing particles from the surface of the silicon wafers being processed. However, the "SC 1" step tends to increase the metal contamination on the surface of the wafer, requiring that a subsequent cleaning step commonly known as "SC 2" be included to reduce the metal contamination from the prior "SC 1" step. Unfortunately, even with this additional "SC 2" step, it has been determined that the remaining metal concentration on the surface of the semiconductor silicon wafer is often not reduced to a low enough level, whereby the remaining metal concentration tends to reduce the yield of devices such as 64M DRAMs and 256M DRAMs, for example. Accordingly, semiconductor manufacturers are conducting ongoing research programs to find ways to further reduce the metal concentration remaining on the silicon wafers after cleaning sequences.

SUMMARY OF THE INVENTION

An object of the invention is to reduce the concentration of metal on the surface of a silicon wafer subsequent to a cleaning sequence during the fabrication of semiconductor devices there- from.

Another object of the invention is to improve the cleaning sequence known as "RCA-clean", for substantially reducing the metal contamination on the surface on the wafer cleaned in such a sequence.

With these and other objects in mind, and to overcome the problems in the prior art, the present inventor has developed an improved "RCA-clean" cleaning sequence for semiconductor manufacturing, wherein in the "SC 1" step of this sequence, a predetermined concentration of a complex building agent selected from the group including EDTA (ethylenediaminetetraacetic acid), or DEQUEST (phosphates with organic chains containing amines) is added to the wet clean mixture or formula of the "SC 1", for retaining metal complexes bound in the cleaning solution, thereby reducing the metal contamination of the surface of the silicon wafer being processing during the cleaning sequence.

BRIEF DESCRIPTION OF THE DRAWINGS

Various embodiments of the present invention are described below with reference to the drawings, in which like items are identified by the same reference designation, and in which:

FIG. 1 shows a flowchart for a semiconductor manufacturing cleaning sequence commonly known as "RCA-clean".

FIG. 2 shows a flowchart for a semiconductor manufacturing cleaning sequence of one embodiment of the invention, that is an improvement of the "RCA-clean" of FIG. 1.

DETAILED DESCRIPTION

In semiconductor manufacturing, typically a silicon wafer is processed to chemically and physically change the wafer. Such processing may include steps for epitaxially growing layers of semiconductor material on a substrate provided by the base silicon wafer, etching portions of the wafer as it is being processed, doping portions of the wafer to have either n or p conductivity, and so forth. During the typically thousands of steps necessary to produce integrated circuit devices, for example, it is necessary at the end of a series of such steps to introduce a cleaning sequence. One such prior cleaning sequence is commonly known as the "RCA-clean", and as shown in FIG. 1 includes a plurality of steps "B" through "G". Typically in the prior art, an additional step, shown as step "A" or the "PIRANHA" step, is added to the "RCA-clean" steps "B" through "G", for providing a "PIRANHA-RCA" cleaning sequence as illustrated in FIG. 1. In the sequence of steps "A" through "G", in "A" or the "PIRANHA" organic contaminants are removed from the silicon wafers being cleaned; in step "C" or "SC 1" particles are removed from the silicon wafer; and in step "E" or "SC 2" metal contaminates are removed from the silicon wafers. Steps "B", "D", and "F" are water rinse steps, and step "G" is a wafer drying step.

It has recently been discovered in the prior art that substantially the same result can be obtained in cleaning silicon wafers using a "dilute chemistry for the RCA-clean steps" relative to the concentration used in the "original RCA-clean" formula. Table 1, as shown below, shows the chemicals and the concentrations for both the original and the dilute "PIRANHA-RCA" cleaning steps "A","C" and "E".

TABLE 1

| NAME OF THE PROCESS STEP | CHEMICAL | CONCENTRATION "ORIGINAL FORMULA" | CONCENTRATION "DILUTE FORMULA" |
|---|---|---|---|
| Piranha | $H_2SO_4$ | 70% by weight | 70% by weight |
| | $H_2O_2$ | 4% by weight | 4% by weight |
| SC 1 | $NH_4OH$ | 4% by weight | 0.004–0.2% by weight |
| | $H_2O_2$ | 5% by weight | 0.003–0.3% by weight |
| SC 2 | HCl | 6% by weight | 0.005–0.5% by weight |
| | $H_2O_2$ | 5% by weight | 0.004–0.5% by weight |

The chemical solution shown in table 1 can either be applied to a silicon wafer by use of a spray tool, whereby the solutions or mixtures are sprayed directly on the wafers, or the silicon wafers are submerged in a bath of the chemical mixture or solution contained within a tank tool. A commonly used spray tool is an "FSI MECURY OC". Also, commonly used tank tools include any one of a "Pokorny Wet Bench", "SMS Wet Bench", a "DNS Auto Cleaner", or a "Sankyo Auto Cleaner".

The present inventor recognized that the metal concentration left on surfaces of silicon wafers cleaned by the "Piranha-RCA" sequence of FIG. 1 often times remains higher than desired, causing a reduced yield during the manufacture of complex integrated circuit such as 64M DRAMs and 256M DRAMs, for example. The present inventor discovered that the metal contamination problem can be substantially reduced by modifying step "C" or the "SC 1" step of the "Piranha RCA" cleaning sequence of FIG. 1, by adding complex building agents selected from the group including EDTA or DEQUEST. In this manner, the metal complexes remain bound in solution, thereby preventing the associated metal from contaminating the surface of the silicon wafers being cleaned. As shown below in Table 2, the concentration of iron (Fe), nickel (Ni) and calcium (Ca), left on a silicon wafer surface after completing a Piranha-RCA cleaning sequence is substantially reduced in using the modified Piranha-RCA of FIG. 2., in comparison to the prior Piranha-RCA cleaning sequence of FIG. 1.

TABLE 2

| METAL | CONCENTRATION WITHOUT COMPLEX BUILDER IN SC 1 | CONCENTRATION WITH COMPLEX BUILDER IN SC 1 |
|---|---|---|
| Fe | 0.9–5 * $10^{10}$ atoms/cm$^2$ | <0.3 * $10^{10}$ atoms/cm$^2$ |
| Ni | 0.5–1.7 * $10^{10}$ atoms/cm$^2$ | <0.5 * $10^{10}$ atoms/cm$^2$ |
| Ca | 0.7–11 * $10^{10}$ atoms/cm$^2$ | <0.5 * $10^{10}$ atoms/cm$^2$ |

*Values with "<" in front show results below detection limit

In the preferred embodiment of the invention, the present inventor discovered that a concentration of EDTA ranging between 0.05 mg/l and 0.10 mg/l in the modified step "C'" or "SC 1" step of the modified cleaning sequence of FIG. 2 provide eptimum results. However, the EDTA concentration required is dependent upon the concentration of other chemicals used in the solution including whether the original or dilute chemistry "Piranha-RCA" is used. For example, it was discovered that optimum results are obtained in adding 0.10 mg/l EDTA to the "SC 1" step of the original "Piranha-RCA" clean formula. Also note that the cleaning sequence improvement of the present invention cannot be used in a spray tool. The reason is that the time between the mixing of the chemicals and the processing of the silicon wafers is too short to permit the chemical complex to form. Accordingly, the present improved process requires that a tank tool be used in cleaning the silicon wafers in step "C'" of FIG. 2.

Also, an automatic injector can be included in the cleaning system hardware for adding a predetermined quantity of the complex builder to the cleaning solution for the "SC 1'" step of the cleaning sequence of FIG. 2. Such automatic injectors are produced by the METROHM Company.

Although various embodiments of the present invention have been shown and described above, they are not meant to be limiting. Certain modifications of these embodiments may occur to those of skill in the art, which modifications are meant to be covered by the spirit and scope of the appended claims.

What is claimed is:

1. A method for reducing the metal contamination on the surface of a silicon wafer during an "RCA-clean" cleaning sequence performed on said silicon wafer in fabricating semiconductor devices therefrom, the improvement comprising:

adding a complex building agent comprising of EDTA to a chemical solution containing $NH_4OH$, $H_2O_2$, and $H_2$ provided for use in an "SC 1" cleaning step of said "RCA-clean", for providing a modified "SC 1" cleaning solution for keeping metal complexes bound in solution to substantially prevent the metal complexes from being retained on the surface of said silicon wafer, wherein the modified "SC 1" cleaning solution comprises a concentration of EDTA ranging from about 0.05 mg/l to about 0.10 mg/l;

retaining said modified "SC 1" cleaning solution in a tank tool; and submerging said silicon wafer in said modified "SC 1" cleaning solution, for a selected period of time during an "SC 1" step of said improved "RCA-clean".

2. The method of claim 1, wherein the concentration of EDTA is about 0.10 mg/l, for addition to an "SC 1" original formula containing about 4% by weight of $NH_4OH$, and about 5% by weight of $H_2O_2$.

3. The method of claim 1, wherein the concentration of EDTA is about 0.05 mg/l, for addition to an "SC 1" dilute formula containing about 0.004% by weight of $NH_4OH$, and about 0.003% by weight of $H_2O_2$.

4. A method for reducing the metal contamination on the surface of a silicon wafer during an "RCA-clean" cleaning sequence performed on said silicon wafer in fabricating semiconductor devices therefrom, the improvement comprising:

adding from a complex building agent comprising amine substituted phosphates to a chemical solution containing $NH_4OH$, $H_2O_2$, and $H_2O$ provided for use in an "SC 1" cleaning step of said "RCA-clean", for providing a modified "SC 1" cleaning solution for keeping metal complexes bound in solution to substantially prevent the metal complexes from being retained on the surface of said silicon wafer, wherein the modified "SC 1" cleaning solution comprises a concentration of amine substituted phosphates ranging from about 0.10 mg/l to about 0.30 mg/l retaining said modified "SC 1" cleaning solution in a tank tool; and submerging said silicon wafer in said modified "SC 1" cleaning solution, for a selected period of time during an "SC 1" step of said improved "RCA-clean".

5. The method of claim 4, wherein the concentration of said amine substituted phosphates is about 0.30 mg/l for addition to an "SC 1" original formula containing about 4% by weight of $NH_4OH$, and about 5% by weight of $H_2O_2$.

6. The method of claim 4, wherein the concentration of said amine substituted phosphates is about 0.10 mg/l, for addition to an "SC 1" dilute formula containing about 0.004% by weight of $NH_4OH$, and about 0.003% by weight of $H_2O_2$.

7. A modified cleaning solution for improving the "SC 1" cleaning step of an "RCA-clean" sequence for silicon wafers, the modified cleaning solution comprising a modified "SC 1" cleaning formulation comprising $NH_4OH$, $H_2O_2$, water, and a complex building agent comprising of EDTA for keeping metal complexes bound in solution during the "SC 1" step of cleaning said silicon wafers, thereby substantially reducing metal contamination of surfaces of said silicon wafers, and wherein the modified "SC 1" solution comprises a concentration of EDTA ranging from about 0.05 mg/l to about 0.10 mg/l.

8. The modified "SC 1" cleaning solution of claim 7, wherein the concentration of EDTA is about 0.10 mg/l, for an "SC 1" original formula containing about 4% by weight of $NH_4OH$, and about 5% by weight of $H_2O_2$.

9. The modified "SC 1" cleaning solution of claim 7, wherein the concentration of EDTA is about 0.05 mg/l, for an "SC 1" dilute formula containing about 0.004% by weight of $NH_4OH$, and about 0.003% by weight of $H_2O_2$.

10. A modified cleaning solution for improving the "SC 1" cleaning step of an "RCA-clean" sequence for silicon wafers, the modified cleaning solution comprising a modified "SC 1" cleaning formulation comprising $NH_4OH$, $H_2O_2$, water, and a complex building agent comprising amine substituted phosphates for keeping metal complexes bound in solution during the "SC 1" step of cleaning said silicon wafers, thereby substantially reducing metal contamination of surfaces of said silicon wafers, and wherein the modified "SC 1" solution comprises a concentration of amine substituted phosphates ranging from about 0.10 mg/l to about 0.30 mg/l.

11. The modified "SC 1" cleaning solution of claim 10, wherein the concentration of amine substituted phosphates is about 0.03 mg/l for an "SC 1" original formula containing about 4% by weight of $NH_4OH$, and about 5% by weight of $H_2O_2$.

12. The modified "SC 1" cleaning solution of claim 10, wherein the concentration of amine substituted phosphates is about 0.10 mg/l for an "SC 1" dilute formula comprising about 0.004% by weight of $NH_4OH$, and about 0.003% by weight of $H_2O_2$.

13. The modified "SC 1" cleaning solution of claim 7, wherein said complex building agent comprises a concentration of EDTA ranging from about 0.05 mg/l to about 0.10 mg/l for concentrations of $NH_4OH$ ranging from about 0.004% by weight to about 4% by weight, respectively, and of $H_2O_2$ ranging from about 0.003% by weight to about 5% by weight, respectively.

14. The modified "SC 1" cleaning solution of claim 10, wherein said complex building agent comprises a concentration of amine substituted phosphates ranging from about 0.10 mg/l to about 0.30 mg/l, for concentrations of $NH_4OH$ ranging from about 0.004% by weight to about 4% by weight, respectively, and of $H_2O_2$ ranging from about 0.003% by weight to about 5% by weight, respectively.

* * * * *